US009456274B2

(12) United States Patent
Zerbini et al.

(10) Patent No.: US 9,456,274 B2
(45) Date of Patent: Sep. 27, 2016

(54) DIGITAL ELECTRONIC INTERFACE CIRCUIT FOR AN ACOUSTIC TRANSDUCER, AND CORRESPONDING ACOUSTIC TRANSDUCER SYSTEM

(71) Applicant: STMICROELECTRONICS S.R.L., Agrate Brianza (IT)

(72) Inventors: Martino Zerbini, Lodi (IT); Luca Molinari, Piacenza (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 364 days.

(21) Appl. No.: 13/936,096

(22) Filed: Jul. 5, 2013

(65) Prior Publication Data

US 2014/0133677 A1 May 15, 2014

(30) Foreign Application Priority Data

Nov. 14, 2012 (IT) .............................. TO2012A0987

(51) Int. Cl.
*H04B 1/00* (2006.01)
*H04R 3/00* (2006.01)
(Continued)

(52) U.S. Cl.
CPC ............. *H04R 3/005* (2013.01); *H04R 19/005* (2013.01); *H04R 25/407* (2013.01)

(58) Field of Classification Search
CPC ... H04R 3/005; H04R 25/407; H04R 19/005
USPC ............................................ 381/57, 119, 122
See application file for complete search history.

(56) References Cited

U.S. PATENT DOCUMENTS 6,271,780 B1 8/2001 Gong et al.
7,359,504 B1 4/2008 Reuss et al.
(Continued)

FOREIGN PATENT DOCUMENTS

EP 1 962 546 A2 8/2008
JP 62-213400 A 9/1987
(Continued)

OTHER PUBLICATIONS

U.S. Appl. No. 13/978,531, field Jul. 5, 2013, Acoustic Transducer and Microphone Using the Acoustic Transducer.
(Continued)

*Primary Examiner* — Vivian Chin
*Assistant Examiner* — Ammar Hamid
(74) *Attorney, Agent, or Firm* — Seed IP Law Group PLLC

(57) ABSTRACT

A interface circuit for an acoustic transducer provided with a first detection structure and a second detection structure has: a first input and a second input; a first processing path and a second processing path coupled, respectively, to the first input and second input and supply a first processed signal and a second processed signal; and a recombination stage, which supplies a mixed signal by combining the first processed signal and the second processed signal with a respective weight that is a function of a first level value of the first processed signal. The first and second inputs receive a respective detection signal associated, respectively, to the first detection structure and to the second detection structure of the acoustic transducer; and an output stage the first processed signal, the second processed signal or the mixed signal, on the basis of a second level value of the first processed signal.

17 Claims, 3 Drawing Sheets

(51) Int. Cl.

| | |
|---|---|
| *H03G 3/00* | (2006.01) |
| *H04R 19/00* | (2006.01) |
| *H04R 25/00* | (2006.01) |

(56) References Cited

U.S. PATENT DOCUMENTS

| | | | | |
|---|---|---|---|---|
| 8,223,981 | B2 | 7/2012 | Haila et al. | |
| 2004/0252855 | A1 | 12/2004 | Vasserman et al. | |
| 2009/0316916 | A1* | 12/2009 | Haila ..................... | H04R 3/005 381/57 |
| 2010/0284553 | A1 | 11/2010 | Conti et al. | |
| 2011/0029109 | A1 | 2/2011 | Thomsen et al. | |
| 2012/0093333 | A1 | 4/2012 | Hu et al. | |
| 2014/0010374 | A1* | 1/2014 | Kasai ....................... | H04R 3/00 381/26 |
| 2014/0133677 | A1 | 5/2014 | Zerbini et al. | |

FOREIGN PATENT DOCUMENTS

| | | | |
|---|---|---|---|
| JP | 10-126886 | A | 5/1998 |
| JP | 2011-4129 | A | 1/2011 |
| WO | 2012/093598 | A1 | 7/2012 |

OTHER PUBLICATIONS

U.S. Appl. No. 13/936,104, filed Jul. 5, 2013, Acoustic Transducer.

U.S. Appl. No. 13/936,110, filed Jul. 5, 2013, Acoustic Transducer and Interface Circuit.

U.S. Appl. No. 14/626,636, filed Feb. 19, 2015, Processing Circuit for a Multiple Sensing Structure Digital Microelectromechanical Sensor Having a Broad Dynamic Range and Sensor Comprising the Processing Circuit.

Office Action dated Sep. 2, 2014, for corresponding Japanese Application No. 2011-002313, with partial English Translation, 5 pages.

* cited by examiner

DIGITAL ELECTRONIC INTERFACE CIRCUIT FOR AN ACOUSTIC TRANSDUCER, AND CORRESPONDING ACOUSTIC TRANSDUCER SYSTEM

BACKGROUND

1. Technical Field

The present disclosure relates to a digital electronic interface circuit for an acoustic transducer and to a corresponding acoustic transducer system.

2. Description of the Related Art

Acoustic transducers, for example MEMS (microelectromechanical system) microphones, are known, including a micromechanical sensing structure, designed to transduce acoustic pressure waves into an electrical quantity (for example, a capacitive variation), and a reading electronics, designed to carry out suitable processing operations (amongst which amplification and filtering operations) of the electrical quantity so as to supply an electrical output signal, either analog (for example, a voltage) or digital (for example, a PDM—pulse density modulation—signal).

This electrical signal, possibly further processed by an electronic interface circuit, is then made available for an external electronic system, for example a microprocessor control circuit of an electronic apparatus incorporating the acoustic transducer.

The micromechanical sensing structure in general includes a mobile electrode, provided as a diaphragm or membrane, set facing a fixed electrode to provide the plates of a variable-capacitance detection capacitor. The mobile electrode is generally anchored, by means of a perimetral portion thereof, to a substrate, whilst a central portion thereof is free to move or deflect in response to the pressure exerted by incident acoustic pressure waves. The mobile electrode and the fixed electrode provide a capacitor, and the deflection of the membrane that constitutes the mobile electrode causes a variation of capacitance as a function of the acoustic signal to be detected.

In general, the electrical performance of the acoustic transducer depends on the mechanical characteristics of the sensing detection structure, and moreover on the configuration of the associated, front and rear, acoustic chambers, i.e., of the chambers facing a respective, front or rear, face of the membrane, and traversed in use by the pressure waves that impinge upon the membrane and that move away therefrom.

There are numerous applications in which detection of acoustic-pressure waves with a wide dynamic range are used, i.e., the possibility of detecting signals with a high sound-pressure level (SPL), while maintaining high values of the signal-to-noise ratio (SNR), and signals with a low sound-pressure level with a high sensitivity.

Basically, a frequently important design rule is to optimize the compromise between obtaining a wide dynamic range in detection of the acoustic-pressure waves and obtaining a low signal-to-noise ratio.

U.S. Pat. No. 6,271,780 to Gong et al., discloses, in this connection, a solution for increasing the dynamic range in an acoustic system, comprising an analog-to-digital converter (ADC), designed to receive an analog detection signal from an acoustic transducer. This solution envisages subjecting the analog input signal, in parallel, to two signal-processing paths, which have a first, analog, portion and a second, digital, portion, and each of which has a respective amplification and gain factor so as to adapt, respectively, to signals with a low, or a high, acoustic pressure level. The two digital signals at output from the two processing paths are recombined to supply a resulting output signal. Prior to the operation of recombination, the two signals undergo an operation of equalization to take into account differences of gain, offset, and phase generated by the previous operations of signal processing, in part of an analog type, and thus prevent distortion of the resulting output signal.

This solution is not free from problems, due mainly to the complexity of the processing chain, to a relevant sensitivity to noise and oscillations of the input signal, and to a reduced configurability.

In general, it is thus certainly felt to provide an improved solution for extending the dynamic range in the detection of acoustic-pressure waves via an acoustic transducer.

BRIEF SUMMARY

According to the present disclosure, a digital electronic interface circuit for an acoustic transducer and a corresponding acoustic transducer system are consequently provided.

An embodiment of the present disclosure is directed to a device that includes an audio signal processing circuit configured to receive a first audio signal and a second audio signal from a first membrane and a second membrane, respectively. The circuit includes a first processing path configured to process the first audio signal and configured to generate a first processed signal, a second processing path configured to process the first audio signal and configured to generate a second processed signal, and a recombination stage configured to receive the first processed signal and the second processed signal and configured to generate a mixed signal. The circuit also includes a selection stage configured to generate a selection signal based on a comparison of the first processed signal with an upper threshold value and a lower threshold value and a multiplexor configured to output one of the first processed signal, the second processed signal, the mixed signal based on the selection signal.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein.

DETAILED DESCRIPTION

Figure 1:
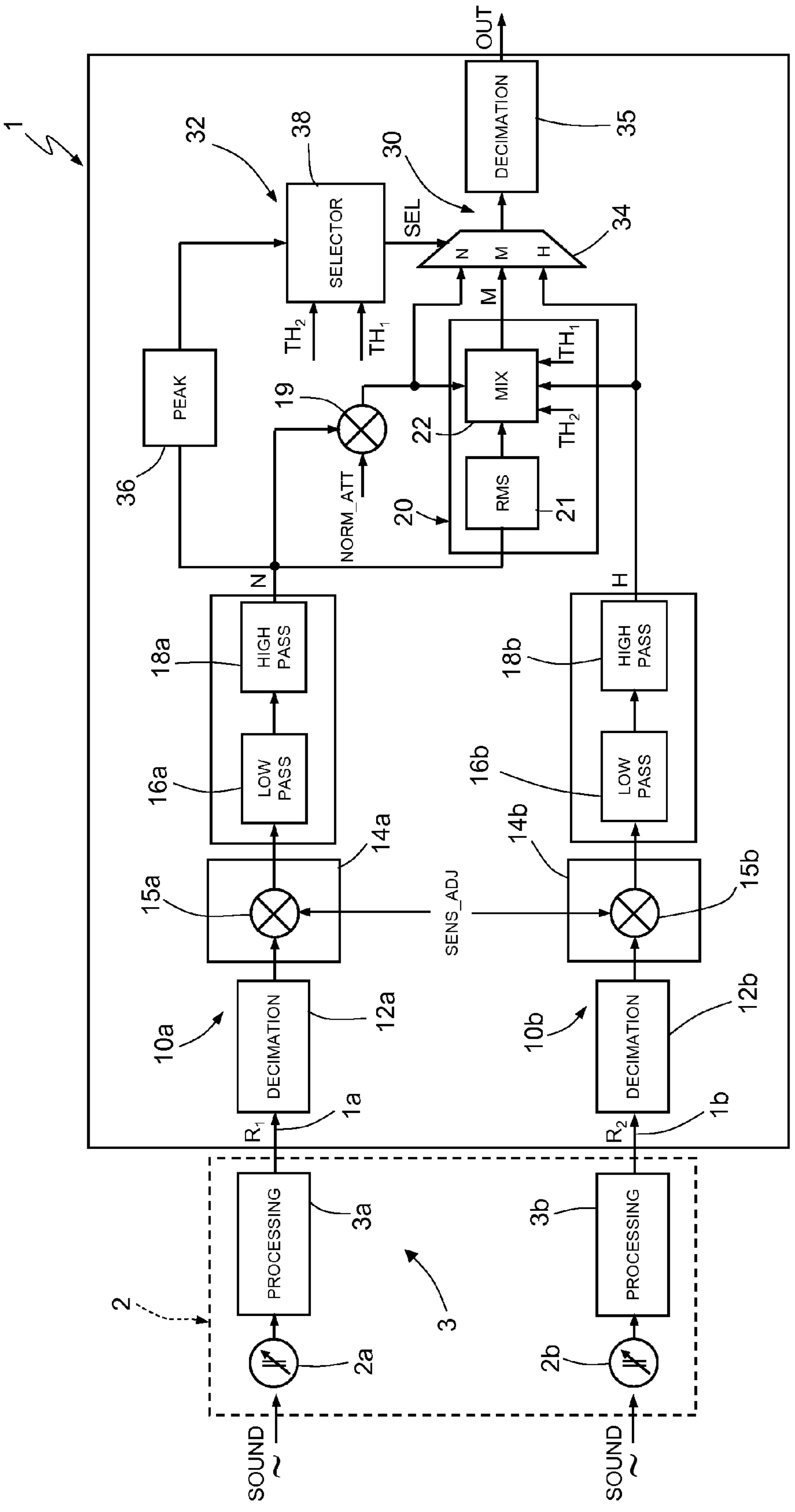
FIG. 1 is a block diagram of a digital electronic interface circuit, coupled to an acoustic transducer, according to an aspect of the present solution.

FIG. 1 shows a digital electronic interface circuit, designated as a whole by 1, for an acoustic transducer, designated by 2.

The acoustic transducer 2, shown schematically herein, comprises a first micromechanical sensing structure 2*a* and a second micromechanical sensing structure 2*b*, distinct from the first, for example provided in a distinct die of semiconductor material, or in a distinct portion of one and the same die of semiconductor material.

The micromechanical sensing structures 2*a*, 2*b* are represented schematically in FIG. 1 by means of a respective capacitor, with a capacitance that varies as a function of the incident acoustic-pressure waves.

Each micromechanical sensing structure 2*a*, 2*b* may comprise a respective membrane, designed to undergo a deformation as a function of the incident acoustic-pressure waves; the micromechanical sensing structures 2*a*, 2*b* have different mechanical characteristics, for example in terms of a different rigidity in regard to deformations, which determine different electrical characteristics in detection of the acoustic-pressure waves.

In particular, the first micromechanical sensing structure 2*a* is configured for detecting signals having a first (maximum) sound-pressure level, for example with an acoustic overload point (AOP) of 120 dBSPL, whereas the second micromechanical sensing structure 2*b* is configured for detecting signals having a second acoustic pressure level, higher than the first level, for example with an AOP of 140 dBSPL.

The acoustic transducer 2 may be, for example, provided as described in patent application No. WO2012093598.

In this case, the first and second micromechanical sensing structures 2*a*, 2*b* are provided by one and the same mobile membrane, which is appropriately separated into two electrically insulated portions, facing a respective fixed electrode so as to form two detection capacitors: a first peripheral portion, designed to detect high sound-pressure levels with a low sensitivity, and a central portion, which undergoes greater elastic deformations, designed to detect lower sound-pressure levels, but with a higher sensitivity.

The acoustic transducer 2 further comprises an ASIC electronic circuit 3, having: a first channel 3*a*, which is coupled to the first micromechanical sensing structure 2*a*, and supplies, on a first output, a first detection signal $R_1$, of a digital type, as a function of the electrical signals transduced by the first micromechanical sensing structure 2*a*; and a second channel 3*b*, which is coupled to the second micromechanical sensing structure 2*b* and supplies on a second output a second detection signal $R_2$, of a digital type, as a function of the electrical signals transduced by the second micromechanical sensing structure 2*b*.

Given the same signal (i.e., in the presence of one and the same value of sound pressure level (SPL)) the first channel 3*a* hence has an electrical signal of a higher value than the second channel 3*b*.

The first and second detection signals are, for example, PDM (pulse-density modulation) signals, and the first and second channels 3*a*, 3*b* include a respective sigma-delta modulator (of a known type, not described in detail herein).

Alternatively, as is, for example, described in patent application No. WO2012093598, the ASIC 3 may have a single output, on which the detection signals are combined in a suitable manner (for example, with an interlacing technique). In this case, a reconstruction stage is used for reconstruction of the detection signals starting from the interlaced flow of data, for their subsequent processing.

The digital electronic interface circuit 1 has a first input 1*a* and a second input 1*b*, which are designed to receive, respectively, the first and second detection signals $R_1$, $R_2$, directly from the acoustic transducer 2, or, alternatively, from the appropriate reconstruction stage for reconstruction of the signals starting from the data flow present on the possible single output of the acoustic transducer 2.

According to one aspect of the present solution, the digital electronic interface circuit 1 carries out, as described in detail hereinafter, a recombination operation for recombination of the first and second detection signals $R_1$, $R_2$, for generating a resulting output signal in order to widen the dynamic range and achieve an optimized compromise with the signal-to-noise ratio.

Figure 2:
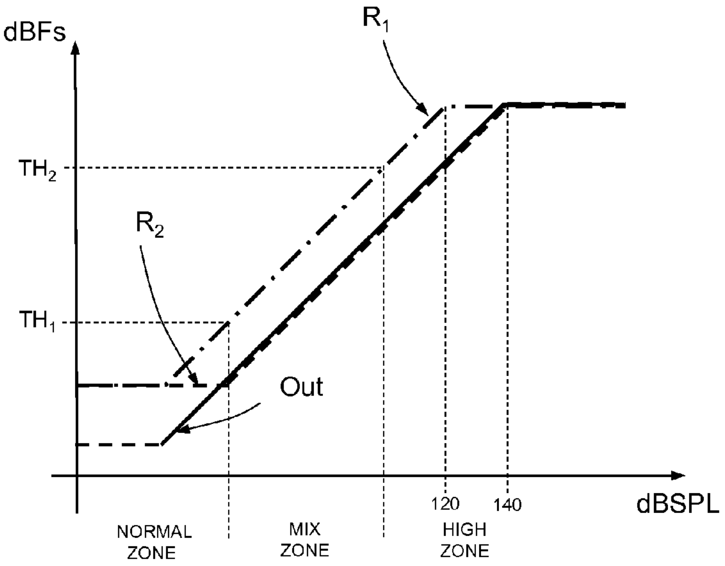
FIG. 2 shows plots of acoustic quantities associated to the acoustic transducer of FIG. 1.

In general, this recombination operation, illustrated schematically in FIG. 2, is based on level measurements of the level of the first detection signal $R_1$ and on the comparison of the measured levels with a lower threshold and with an upper threshold, designated by $Th_1$ and $Th_2$, respectively, in FIG. 2:

- if the level of the detection signal is higher than the upper threshold $Th_2$, the resulting output signal (the characteristic curve of which is shown with a solid line) is supplied starting from the processing of the second detection signal $R_2$ at output from the second channel 3*b* (the characteristic curve of which is shown with a dashed line);
- if the level of the detection signal is lower than the lower threshold $Th_1$, the resulting output signal is supplied starting from the processing of the first detection signal $R_1$ at output from the first channel 3*a* (the characteristic curve of which is shown with a dashed-and-dotted line); and
- if the level of the detection signal is comprised between the lower threshold $Th_1$ and the upper threshold $Th_2$, the resulting output signal is supplied starting from a suitable combination of the first and second detection signals $R_1$, $R_2$.

In detail, as shown in FIG. 1, the interface circuit 1 comprises a first processing branch 10*a*, connected to the first input 1*a* and designed to carry out digital processing of the first detection signal $R_1$, and a second processing branch 10*b*, connected to the second input 1*b* and designed to carry out digital processing of the second detection signal $R_2$.

Each processing branch 10*a*, 10*b* comprises: a respective first decimation block 12*a*, 12*b*, which receives at input the first detection signal $R_1$ or the second detection signal $R_2$, respectively, and carries out an operation of decimation on the samples of the same signal (the decimation process also comprising a finite impulse response (FIR) low-pass filtering), and a respective adjustment block 14*a*, 14*b*, including a respective first multiplier 15*a*, 15*b*, for multiplying the signal at output from the first decimation stage 12*a*, 12*b* by an adjustment factor Sens_Adj, of a configurable value and such as to compensate for any possible differences between a theoretical value and an effective value of the detection sensitivity of the micromechanical sensing structures 2*a*, 2*b* of the acoustic transducer 2.

Each processing branch 10*a*, 10*b* further comprises, cascaded at output from the respective adjustment block 14*a*, 14*b*: a low-pass filtering block 16*a*, 16*b*; and a high-pass filtering block 18*a*, 18*b*.

In particular, the low-pass filtering block 16*a*, 16*b* implements a digital filter, for example of a second-order infinite impulse response (IIR) type with cutoff frequency of 20 kHz, for eliminating possible noise outside the audio band in the first detection signal $R_1$ or the second detection signal $R_2$.

Also the high-pass filtering block 18*a*, 18*b* implements an IIR digital filter in order to eliminate possible DC offset and environmental noise, for example disturbance due to the wind, the so-called "wind noise".

The first processing branch 10*a* further comprises a second multiplier 19, which receives the filtered signal at output from the high-pass filtering block 18$a$, designated by N (corresponding to the processing of the first detection signal $R_1$, for this reason defined in what follows as "first filtered detection signal") and multiplies it by an attenuation factor Norm_Att, of a configurable value and such as to compensate for the differences of sensitivity and gain between the first and second micromechanical sensing structures 2$a$, 2$b$ and between the first and second channels 3$a$, 3$b$ of the ASIC 3 of the acoustic transducer 2.

The interface circuit 1 further comprises a recombination stage 20, including a first level-measurement block 21 and a mixing block 22.

Figure 3:
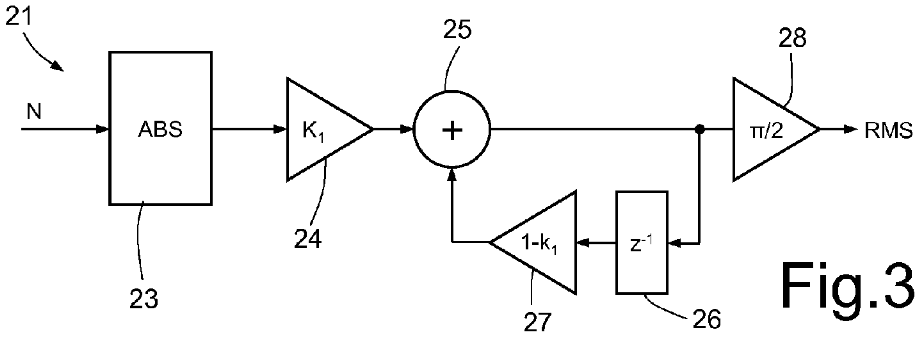
FIG. 3 is a block diagram of a first level meter in the interface circuit of FIG. 1.

The first level-measurement block 21 has an input connected to the output of the high-pass filtering block 18$a$ of the first processing branch 10$a$, and is configured, as illustrated in FIG. 3, so as to measure the root-mean-square (RMS) value of the first filtered detection signal N.

In detail, the first level-measurement block 21 comprises: an absolute-value calculation unit 23, which receives at input the first filtered detection signal N and calculates the absolute value thereof; a first multiplier unit 24, with multiplying factor $K_1$, connected to the output of the absolute-value calculation unit 23; an adder unit 25, having a first sum input, connected to the output of the first multiplier unit 24, a second sum input, and an output; a feedback path connected between the output and the second input of the adder unit 25, and including a unit-delay unit 26 and, cascaded thereto, a second multiplier unit 27, with multiplying factor $(1-K_1)$; and a third multiplier unit 28, with multiplying factor equal to $\pi/2$, having its input connected to the output of the adder unit 25 and its output that supplies the root-mean-square value RMS.

As shown in FIG. 1, the mixing block 22 of the recombination stage 20 has: a first input receiving the root-mean-square value RMS from the first level-measurement block 21; a second input, which is connected to the output of the second multiplier 19 and hence receives the first filtered detection signal N, attenuated by the attenuation factor Norm_Att; a third input, which is connected to the output of the high-pass filtering block 18$b$ of the second processing branch 10$b$ and hence receives the second filtered detection signal (designated by H); and a fourth input and a fifth input, which receive, respectively, the lower threshold $Th_1$ and the upper threshold $Th_2$, having configurable values.

The mixing block 22 is configured so as to supply at output a mixing signal, designated by M, which is given by the following expression:

$$M = H\left[1 - \frac{Th_2 - \text{RMS}}{Th_2 - Th_1}\right] + N\left[\frac{Th_2 - \text{RMS}}{Th_2 - Th_1}\right]$$

Basically, the mixing signal M is obtained by means of the weighted combination of the first and second filtered detection signals N, H (the first filtered detection signal N being also appropriately attenuated), with a weight that is a function of the distance of the level of the acoustic signal detected from the set threshold, in particular the upper threshold $Th_2$.

As it will be clear, in the limit case where the level of the detected acoustic signal, in particular the root-mean-square value RMS of the first filtered detection signal N, is equal to the upper threshold $Th_2$, the mixing signal corresponds to the second filtered detection signal H, whereas in the limit case where the level of the detected acoustic signal is equal to the lower threshold $Th_1$, the mixing signal corresponds to the first filtered detection signal N.

The interface circuit 1 further comprises an output stage 30 and a selection stage 32.

The output stage 30 in turn comprises a multiplexer unit 34, having: a first input, which is connected to the output of the second multiplier 19 and hence receives the first filtered detection signal N, attenuated by the attenuation factor Norm_Att; a second input, which is connected to the output of the high-pass filtering block 18$b$ of the second processing branch 10$b$ and hence receives the second filtered detection signal H; a third input, which is connected to the output of the recombination stage 20 and receives the mixing signal M; and an output, which is selectively connected alternatively to the first input, to the second input, or to the third input, as a function of a selection signal Sel, which is received from the selection stage 32, as defined more clearly hereinafter.

The output stage 30 further comprises a second decimation block 35, which has its input connected to the output of the multiplexer unit 34 and an output on which it supplies, after an appropriate operation of decimation on the samples of the signal received at input (once again including also a low-pass FIR filtering), the signal at output Out from the interface circuit 1, making it available to an external electronic system.

The selection stage 32 comprises a second level-measurement block 36, and a selector block 38.

Figure 4:
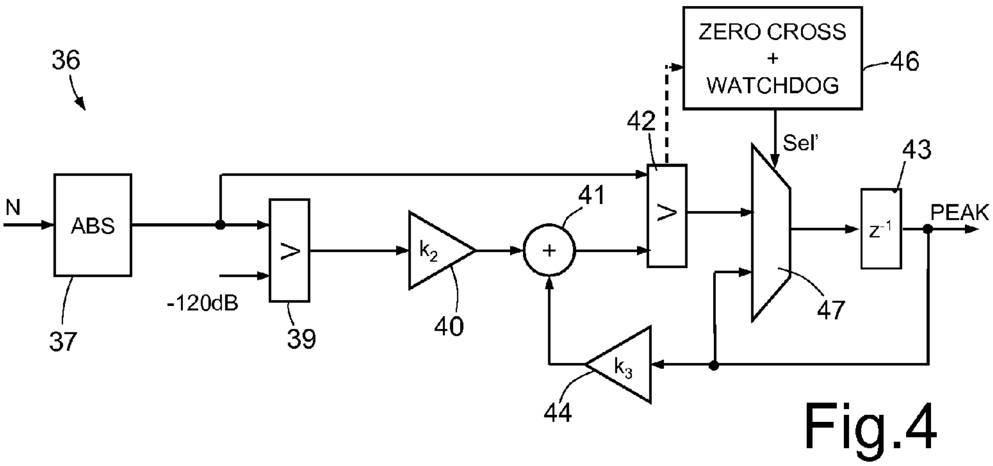
FIG. 4 is a block diagram of a second level meter in the interface circuit of FIG. 1.

The second level-measurement block 36 has an input connected to the output of the high-pass filtering block 18$a$ of the first processing branch 10$a$, and is configured, as illustrated in FIG. 4, so as to measure the peak level of the first filtered detection signal N.

In detail, the second level-measurement block 36 comprises: a respective absolute-value calculation unit 37, which receives at input the first filtered detection signal N and calculates the absolute value thereof; a first comparator unit 39, which compares the absolute value previously calculated with a noise reference value, for example equal to −120 dB, indicating a noise threshold in order to filter the contribution of noise that may be present (hence operating as a sort noise-gate); a respective first multiplier unit 40, with multiplying factor $K_2$, connected to the output of the comparator unit 39; and a respective adder unit 41, having a first sum input, connected to the output of the first multiplier unit 40, a second sum input, and an output.

The second level-measurement block 36 further comprises: a second comparator unit 42, which receives at input the samples of the absolute value of the first filtered detection signal N and the samples of the signal at output from the adder unit 41, and each time determines the highest; and a feedback path, which is connected between the output of the second comparator unit 42 and the second input of the adder unit 41, and includes a respective unit-delay unit 43 and, cascaded thereto, a respective second multiplier unit 44, with multiplying factor $K_3$.

As it will be clear, the adder unit 41, the second comparator unit 42, and the feedback path implement a decay stage, and make it possible to follow the peaks of the input signal and hold them with a certain decay factor, determined, amongst other elements, by the values of the multiplying factors $K_2$ and $K_3$ (for example, the decay factor is equal to 3.7 dB/ms).

The second level-measurement block 36 further comprises a control unit 46 and a multiplexer unit 47.

The multiplexer unit 47 has a first input connected to the output of the second comparator unit 42 and a second input connected to the input of the second multiplier unit 44, and an output, which is connected to the output of the second level-measurement block 36, and hence supplies the peak signal Peak, as a function of a control signal Sel'.

The control unit 46 has zero-crossing and watchdog functions and is configured so as to monitor, sample after sample of the digital signals, the result of the comparison carried out by the second comparator unit 42, and so as to generate the control signal Sel' for the multiplexer unit 47.

In particular, the control unit 42 analyses the zero-crossings of the signal that is the result of the comparison carried out in the second comparator unit 42 and enables the decay phase for the peak signal Peak (by closing the feedback path, i.e., connecting the output of the multiplexer 47 to the output of the second comparator unit 42) when it determines a zero-crossing, unless a certain pre-set number of samples of the signals has not yet been reached (the watchdog function being that of counting the samples and closing the feedback path only if a maximum limit has been reached). In this way, it is for example possible to filter anomalous oscillations of the processed signals, at least within a certain pre-set number of samples.

Returning now to the digital electronic interface circuit of FIG. 1, the selector block 38 receives at input the peak signal Peak and the configurable values of the lower threshold $Th_1$ and of the upper threshold $Th_2$, and as a function of these values generates the selection signal Sel to determine the signal to be sent at output from the multiplexer unit 34, according to the recombination algorithm described previously.

In particular, in the case where the value of the peak signal Peak is comprised between the lower threshold $Th_1$ and the upper threshold $Th_2$, the selection signal Sel selects the mixing signal M for the output of the multiplexer unit 34. In the case where the peak signal Peak is lower than the lower threshold $Th_1$, the selection signal Sel selects the first filtered detection signal N (appropriately attenuated) for the output of the multiplexer unit 34. Otherwise, in the case where the peak signal Peak is higher than the upper threshold $Th_2$, the selection signal Sel selects the second filtered detection signal H for the output of the multiplexer unit 34.

Figure 5:
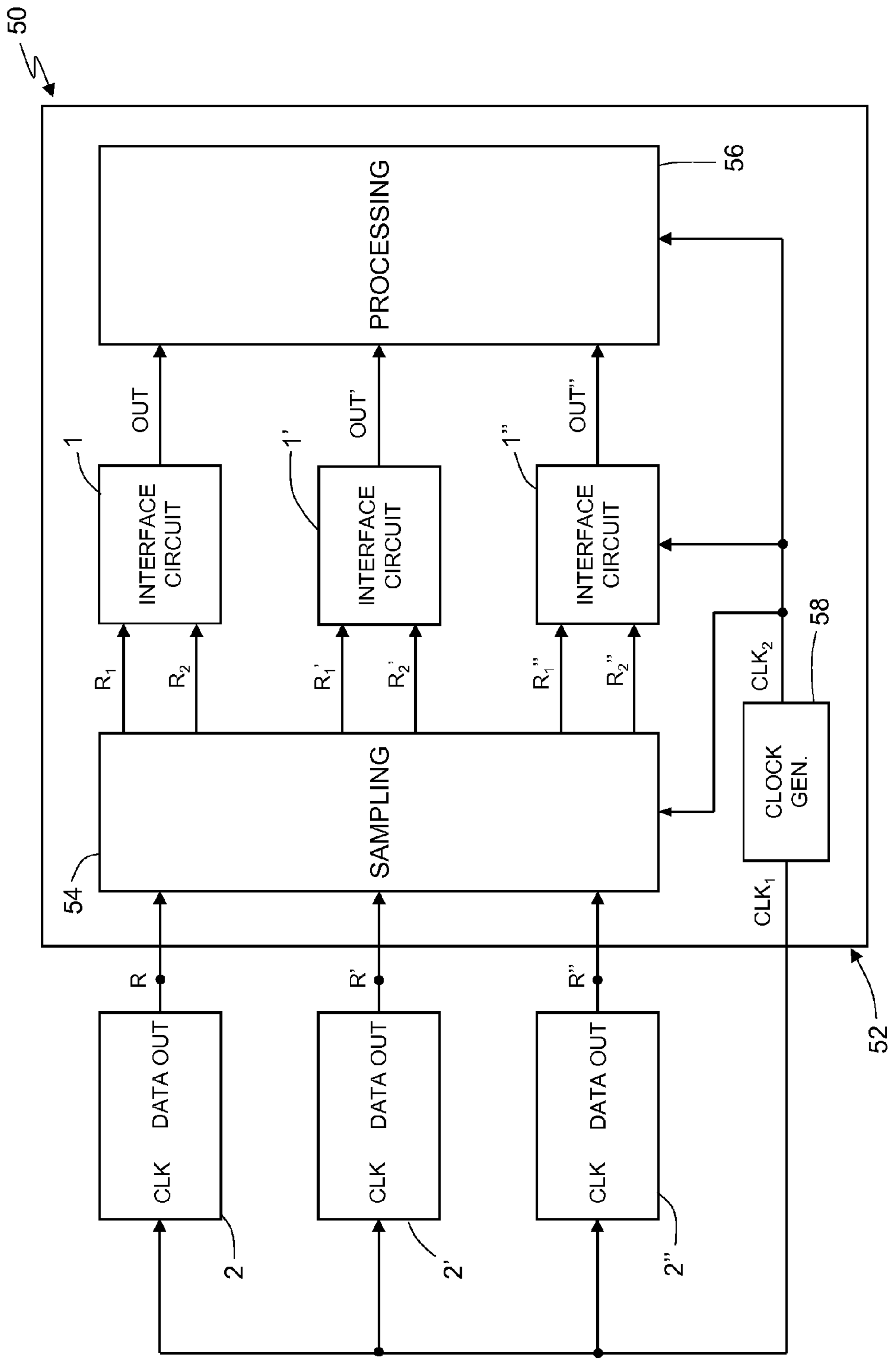
FIG. 5 is a block diagram of an acoustic transducer system, according to a further aspect of the present disclosure.

FIG. 5 shows an exemplary application of what has been described previously, referred to a microphone system, designated as a whole by 50, which comprises three acoustic transducers, designated by 2, 2' and 2", each provided with a pair of micromechanical sensing structures (here not illustrated) and each having a single digital output (here designated as DataOut), provided on which in an interlaced way are the detection signals associated to the micromechanical sensing structures, here designated by R, R' and R".

The microphone system 50 comprises a microprocessor circuit 52, which defines: a sampling stage 54, which receives the digital signals R, R' and R" supplied by the acoustic transducers 2, 2' and 2" and generates, for each of them, the two distinct detection signals $R_1$, $R_2$; $R_1'$, $R_2'$; $R_1''$, $R_2''$ (with known de-interlacing operations); an interface circuit 1, 1' and 1", for each of the acoustic transducers 2, 2' and 2", which receives the respective pair of detection signals and supplies at output a respective output signal, Out, Out' and Out", as previously described in detail; and a digital processing stage 56, which receives the output signals Out, Out' and Out", referred to each of the acoustic transducers 2, 2' and 2", and carries out appropriate processing operations of these signals (for example, for implementing denoising algorithms).

The microprocessor circuit 52 may moreover generate internally, by means of a clock generator 58, a first clock signal $CLK_1$, which is supplied to the acoustic transducers 2, 2' and 2", on a respective clock input CLK, in such a way as to time the operations of detection of the acoustic-pressure signals; and a second clock signal $CLK_2$, having a pre-set relation with the first clock signal $CLK_1$ (for example, being phase shifted by an appropriate angle with respect thereto), which is used inside the microprocessor circuit 52, for the operations of sampling and processing of the acquired detection signals.

In particular, the recombination and processing operations are carried out at a sampling frequency that is higher, for instance sixteen times higher, than a base frequency, thus reducing the latency of the same processing operations.

Based on what has been described and illustrated previously, the advantages that the present solution allows to achieve are evident.

In particular, the presence in the interface circuit 1 of the two distinct processing branches 10*a*, 10*b*, each of which is operatively coupled to a distinct micromechanical sensing structure and receives the corresponding digital detection signal, enables improvement of the electrical performance, in terms of dynamic range, sensitivity and signal-to-noise ratio, as compared, for example, to solutions that envisage generation of two processing paths starting from a single detection signal, of an analog type.

Use, in the interface circuit 1, of two distinct level meters (for the peak value and the root-mean-square value) enables specific advantages to be obtained in processing of the signals: in particular, the peak-level meter enables a fast response to the changes of the signal and at the same time a good measurement stability to be obtained in regard to fluctuations of the signal, thanks to the decay characteristic selectively implemented, thus ensuring timely switching in the selection of the output signal, preventing errors and possible saturation. The RMS-level meter enables a measurement to be obtained that is stable with respect to fluctuations and disturbance (for example, the so-called "glitches"), guaranteeing proper mixing of the detection signals. The output signal does not have amplitude modulations that might be perceived by the human ear (once these are reproduced acoustically).

The same realization of the peak-level meter has specific advantages in the use of a noise-gate function for filtering noise, of a decay filter for improving the measurement of the signal at low frequencies, and a watchdog function with zero crossing for reducing fluctuations and improving the measurement of the signal at high frequencies.

The presence of the low-pass filtering stage 16*a*, 16*b* in each processing branch 10*a*, 10*b* prevents any erroneous estimates of the signal level (usually estimates higher than the effective value), or in any case estimates that are not correlated with the effective value, and prevents saturation in the recombination operations.

The interface circuit 1 is moreover widely configurable, for example, as regards the choice of the lower and upper threshold values $Th_1$, $Th_2$, the adjustment of sensitivity of the processing branches by means of the adjustment factor Sens_Adj and the adjustment of the attenuation factor Norm_Att, thus enabling convenient adaptation to characteristics of various types of microphones (as shown, for example, in FIG. 5, where three acoustic transducers 2, 2', 2" are indeed advantageously used, with characteristics of sensitivity that may be even very different from one another).

In conclusion, it is clear that modifications and variations may be made to what has been described and illustrated so far, without thereby departing from the scope of the present disclosure.

In particular, it is clear that the interface circuit 1 described previously may advantageously be integrated in one and the same chip (or in one and the same die) in which the ASIC 3 of the acoustic transducer 2 is provided, which in this case may supply at output a signal already recombined and optimized with respect to the dynamic range, as a function of the detection signals associated to both of the micromechanical sensing structures with which the same acoustic transducer 2 is internally provided.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A digital interface circuit for an acoustic transducer provided with a first detection structure and a second detection structure, said digital interface circuit comprising:

a first input and a second input configured to receive first and second detection signals, respectively, from the first and second detection structures, respectively;

a first digital processing path and a second digital processing path coupled, respectively, to the first input and the second input and configured to respectively supply a first digital processed signal and a second digital processed signal;

a recombination stage configured to supply a mixed signal, via combination of the first digital processed signal and the second digital processed signal with a respective weight that is a function of a first level value of said first digital processed signal, the recombination stage includes a first level meter configured to measure the first level value based on the first processed signal, the first level meter is configured to measure said first level value as root-mean-square value of said first processed signal; and an output stage configured to selectively supply at an output alternatively said first digital processed signal, said second digital processed signal, and said mixed signal, the output stage includes:

a second level meter configured to measure a second level value as peak value of the first processed signal, the second level value being different from the first level value; and a selector stage configured to select alternatively the first digital processed signal, the second digital processed signal, or the mixed signal, on the basis of the second level value of the first processed signal.

2. The circuit according to claim 1 wherein said second level meter includes:

a decay stage configured to generate a version of said peak value decremented by a factor, and configured to compare with a current sample of said first processed signal; and a noise-filtering block, configured to receive samples of said first processed signal and configured to provide the samples to be compared in the case where the samples satisfy a given relation with a pre-set noise threshold.

3. The circuit according to claim 2 wherein said second level meter includes a control block, configured to selectively enable said decay stage.

4. The circuit according to claim 3 wherein said second level meter includes:

a comparator unit configured to compare said current sample of said first processed signal with the decremented peak value, and configured to generate, sample after sample, a comparison signal; and wherein said control block is configured to enable said decay stage, upon detection of a zero-crossing of the comparison signal and after waiting a pre-set number of samples.

5. The circuit according to claim 3 wherein said noise-filtering block is configured to implement a noise-gate function, and said control block is configured to implement a watchdog function with zero crossing.

6. The circuit according to claim 1 wherein said selector stage is configured to receive said second level value, a lower threshold value and an upper threshold value, and to generate a selection signal as a function of a comparison between said second level value and said lower and upper threshold values; and wherein said output stage includes a multiplexer stage, configured to receive said selection signal and supply at output alternatively said first processed digital signal, said second processed digital signal, or said mixed signal, on the basis of said selection signal.

7. The circuit according to claim 1 wherein said recombination stage is configured to receive said first level value, a lower threshold value, and an upper threshold value, and to generate said mixed signal as a function of said first processed signal and second processed signal, and is configured to associate a respective weight that is a function of said first level value, of said lower threshold value, and of said upper threshold value with said first processed signal and second processed signal.

8. The circuit according to claim 6 wherein said lower threshold value and said upper threshold value are configurable.

9. The circuit according to claim 1 wherein said first digital processing path and second digital processing path are configured to receive said detection signals associated with said first detection structure and second detection structure of said acoustic transducer, which have different sensitivities in the detection of acoustic-pressure waves; and wherein associated with said first detection signal is a higher sensitivity in the detection of said acoustic-pressure waves.

10. The circuit according to claim 9, further comprising a sensitivity-adjustment stage, configured to apply a corrective factor, of configurable value, to a value of said detection signals to take into account a variation of a value of said sensitivities with respect to a theoretical value.

11. The circuit according to claim 1 wherein each of said first processing path and second processing path includes, cascaded to one another, a low-pass filter and a high-pass filter configured to remove contributions of noise outside a pre-set frequency band.

12. The circuit according to claim 1 wherein said detection signals are pulse density modulation digital signals.

13. An acoustic transducer system, comprising:

a first detection structure and a second detection structure, which are separate and distinct from one another and have different characteristics of detection of acoustic-pressure waves; and a digital interface circuit, coupled to said first detection structure and second detection structure, the digital interface circuit including:

first and second inputs configured to receive first and second detection signals, respectively, from the first and second detection structures, respectively;

a first digital processing path and a second digital processing path, which are coupled to the first input and the second input, respectively, and are configured to supply a first digital processed signal and a second digital processed signal, respectively;

a recombination stage configured to supply a mixed signal, via combination of said first processed signal and second processed signal with a respective weight that is a function of a first level value of said first processed signal, the recombination stage including a first level meter configured to measure the first level value based on the first processed signal, the first level meter is configured to measure said first level value as root-mean-square value of said first processed signal;

a second level meter configured to measure the second level value as peak value of the first processed signal; and an output stage configured to selectively supply at an output alternatively said first digital processed signal, said second digital processed signal, and said mixed signal on the basis of the second level value of the first processed signal.

14. The system according to claim 13, further comprising:

an ASIC circuit, electrically connected to said first detection structure and said second detection structure; wherein said digital interface circuit and said ASIC circuit are integrated in one and the same chip.

15. The system according to claim 13, further comprising:

an ASIC circuit, electrically connected to said first detection structure and said second detection structure and configured to receive and process respective electrical signals and generate an interlaced detection signal including information associated with both of the electrical signals;

said system including a sampling stage configured to receive said interlaced detection signal and configured to generate said first detection signal and said second detection signal for said digital interface circuit, each associated to a respective one of said first detection structure and said second detection structure.

16. A device, comprising:

an audio signal processing circuit configured to receive a first audio signal and a second audio signal from a first membrane and a second membrane, respectively, the circuit including:

a first processing path configured to process the first audio signal and configured to generate a first processed signal;

a second processing path configured to process the first audio signal and configured to generate a second processed signal;

a recombination stage configured to receive the first processed signal and the second processed signal and configured to generate a mixed signal, the recombination stage includes:

a first measurement module configured to receive the first processed signal and configured to generate a first measured signal, the first measurement module is configured to measure a root-mean-square value of the first processed signal;

a mixing module configured to receive the first measured signal, the second processed signal, an upper threshold value, and a lower threshold value, and configured to generate the mixed signal; and a second measurement module configured to receive the first processed signal and configured to generate a peak signal, the second measurement module includes:

an absolute value calculation unit configured to receive the first processed signal and configured to generate an absolute value signal; and a comparator unit configured to compare the absolute value signal with a noise reference value;

a selection stage configured to receive the peak signal and configured to generate a selection signal based on a comparison of the first processed signal with the upper threshold value and the lower threshold value; and a multiplexor configured to output one of the first processed signal, the second processed signal, the mixed signal based on the selection signal.

17. The device of claim 16 wherein the second measurement module is configured to identify a peak of the first processed signal and is configured to generate the peak signal based on the peak.

* * * * *